United States Patent [19]

Meunier et al.

[11] Patent Number: 4,827,218
[45] Date of Patent: May 2, 1989

[54] LINEAR MAGNETORESISTANCE-EFFECT SENSOR WITH SEMICONDUCTOR AND FERRIMAGNETIC LAYERS AND ITS APPLICATION IN A MAGNETIC-DOMAIN DETECTOR

[75] Inventors: Paul L. Meunier, Paris; Ernst Huijer; Manijeh Razeghi, both of Orsay; Jean C. Lehureau, St. Genevieve de Bois, all of France

[73] Assignee: Thomson-CSF, Paris, France

[21] Appl. No.: 145,720

[22] Filed: Jan. 15, 1988

Related U.S. Application Data

[63] Continuation of Ser. No. 867,216, May 27, 1986, abandoned.

[30] Foreign Application Priority Data

May 30, 1985 [FR] France ............... 85 08162

[51] Int. Cl.⁴ .............. G01R 33/06; H01L 43/00; H01L 27/22; G06K 7/08
[52] U.S. Cl. .................... 324/252; 235/450; 324/260; 338/32 R; 357/27; 360/113; 427/128; 437/2
[58] Field of Search .......... 324/207, 208, 228, 235, 324/249, 251, 252; 307/309; 338/32 R, 32 H; 357/27; 360/112, 113; 156/600, 603, 610–614; 427/58, 101–103, 126.1, 128; 437/2–5, 918, 245; 235/449, 450

[56] References Cited

U.S. PATENT DOCUMENTS

| | | | |
|---|---|---|---|
| 3,607,390 | 9/1971 | Comstock et al. | 156/603 |
| 3,731,123 | 5/1973 | Matsushita | 357/27 X |
| 3,848,217 | 11/1974 | Lazzari | 338/32 R |
| 3,898,359 | 8/1975 | Nadkarni | |
| 3,909,710 | 9/1975 | Newburgh et al. | 324/208 |
| 3,943,481 | 3/1976 | Masuda et al. | 338/32 R |
| 4,021,767 | 5/1977 | Nonaka et al. | 357/27 X |
| 4,046,618 | 9/1977 | Chaudhari et al. | 156/603 |
| 4,057,458 | 11/1977 | Maeda et al. | 156/603 |
| 4,097,802 | 6/1978 | Mahopac | 338/32 R X |
| 4,147,584 | 4/1979 | Garrison et al. | 156/603 X |
| 4,398,342 | 8/1983 | Pitt et al. | 357/27 X |
| 4,565,584 | 1/1986 | Tamura et al. | 156/603 X |
| 4,587,509 | 5/1986 | Pitt et al. | 338/32 R X |
| 4,607,271 | 8/1986 | Popovic et al. | 324/252 X |
| 4,624,901 | 11/1986 | Glass | 156/600 X |

OTHER PUBLICATIONS

Patent Abstracts of Japan, vol. 7, No. 292 (E-219) [1437], Dec. 27, 1983, "Magnetoelectricity Converting Element", 58-166781, Pioneer K. K. et al.

Thin Solid Films, vol. 100, No. 2, Feb. 1983, pp. 81–109, Elsevier Sequoia, Lasusanne, "Magnetoresistance in Amorphous Semiconductors", R. M. Mehra et al.

Primary Examiner—Gerard R. Strecker
Attorney, Agent, or Firm—Oblon, Fisher, Spivak, McClelland & Maier

[57] ABSTRACT

A magnetoresistance-effect sensor for use in a magnetic domain detector for reading data recorded on magnetic tapes or in magnetic bubble memories mainly consists of a layer of semiconductor material which carries a layer of ferrimagnetic material on one face and at least one pair of electrodes disposed along an axis OX on the other face, the layer of ferrimagnetic material being placed in proximity to the magnetic data carrier. A magnetic data item thus induces a magnetic field in the layer of semiconductor material in a direction OY perpendicular to the axis OX of the pair of electrodes.

13 Claims, 3 Drawing Sheets

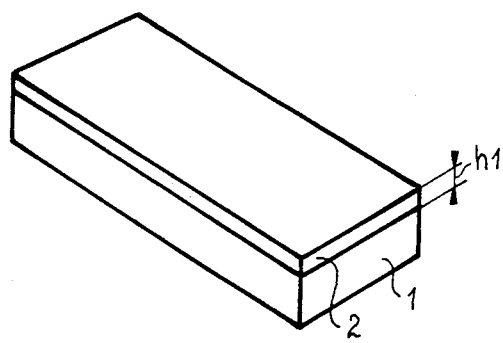
FIG_1
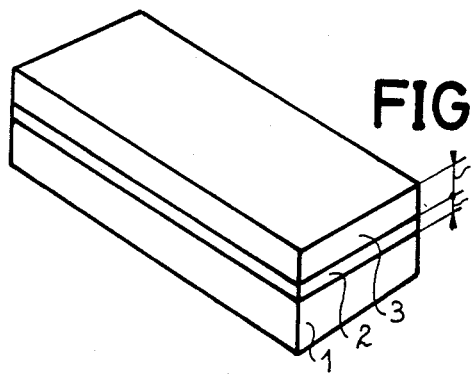
FIG_2
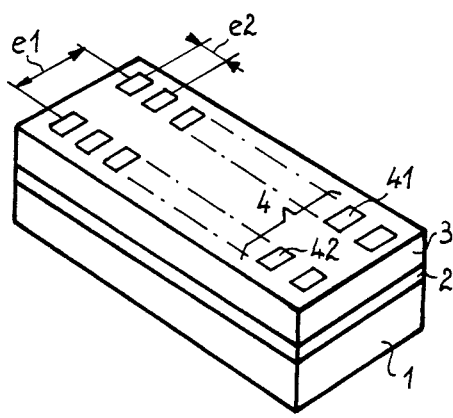
FIG_3
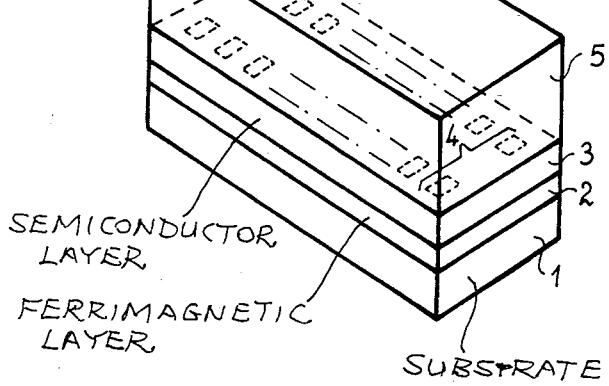
FIG_4

FIG_5
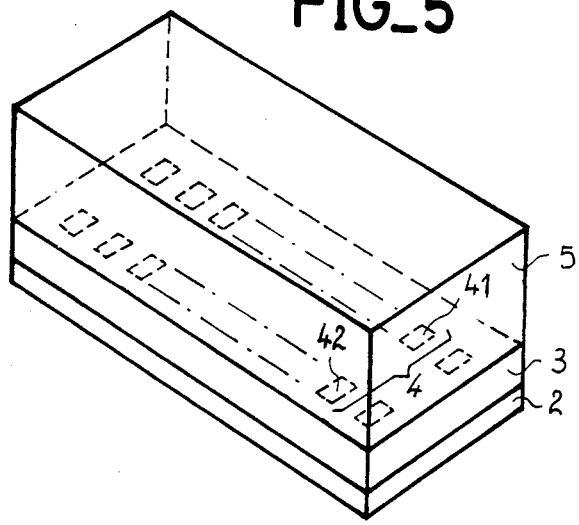
FIG_6
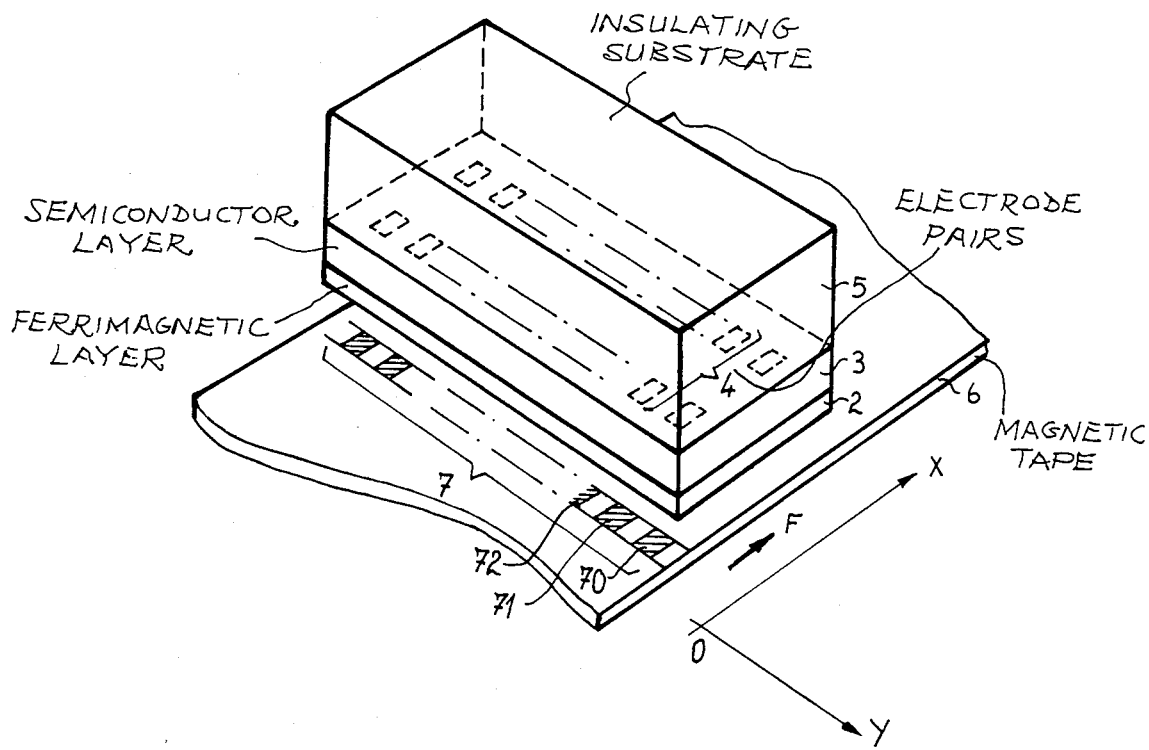

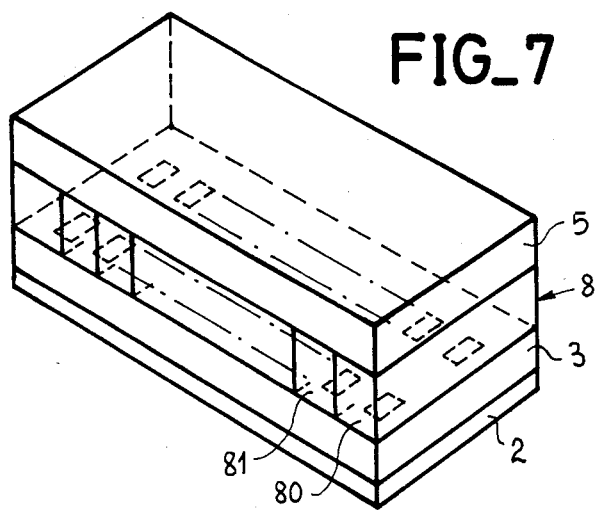
FIG_7
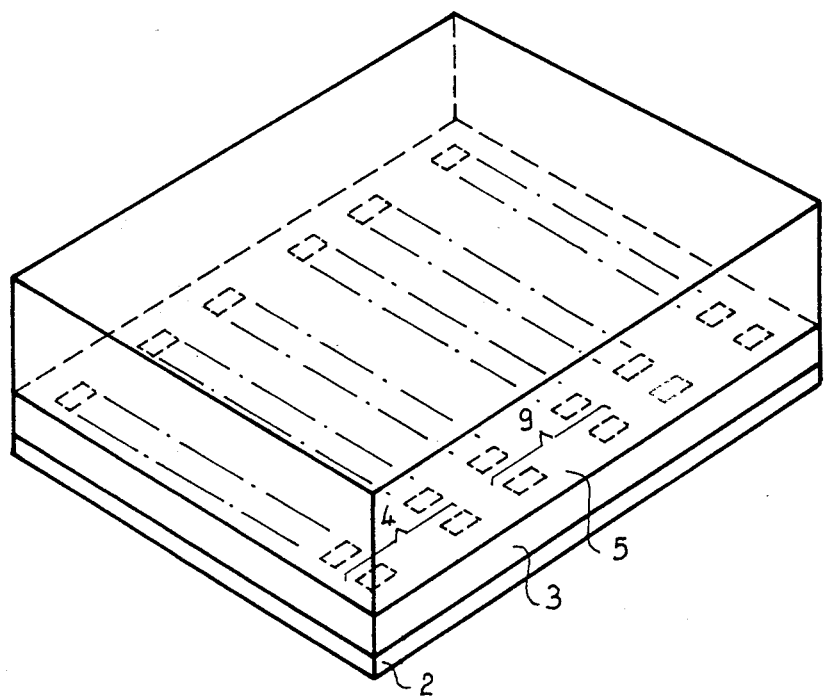
FIG_8

LINEAR MAGNETORESISTANCE-EFFECT SENSOR WITH SEMICONDUCTOR AND FERRIMAGNETIC LAYERS AND ITS APPLICATION IN A MAGNETIC-DOMAIN DETECTOR

This application is a continuation of application Ser. No. 867,216, filed on May 27, 1986 now abandoned.

BACKGROUND OF THE INVENTION

1. Field of the Invention

This invention relates to a magnetoresistance-effect sensor, a method of fabrication of said sensor and the application of this latter to a magnetic-domain detector. A detector of this type can be employed for reading magnetic data carriers and permits simultaneous reading of a set of data.

2. Description of the Prior Art

Sensors which utilize the linear magnetoresistance (LMR) effect are already known.

Consider a thin film of semiconductor (a few microns in thickness) in which a high current is flowing. When they are subjected to a magnetic field perpendicular to the current in the plane of the film layer, the carriers (electrons and holes) are deflected perpendicularly to the layer and in the same direction. The conventional Hall effect postulates that the currents of the two carriers are different. The forces applied to the majority carriers are cancelled by the Hall effect. In the LMR effect, the currents are balanced and no field counteracts the deflection of the carriers which collect on one of the boundary surfaces of the layer. The rates of recombination on each of these surfaces are chosen so as to be very different, thereby increasing or reducing the mean concentration of carriers in the layer according to the direction of the magnetic field. The resistance of the layer to the injected current varies linearly with the magnetic field.

At the present time, this effect is too small to permit reading of data recorded on magnetic data carriers such as a magnetic tape in which the magnetic fields developed by the written bits are too weak. In point of fact, a leakage field of a few tens of Gauss at a distance of 3 $\mu$m to 5 $\mu$m is not strong enough to induce a sufficiently large current in the semiconductor layer. A field having a value of several hundred Gauss is required.

It is for the reason just given that the present invention provides a sensor for amplifying and reading magnetic data and therefore magnetic fields of low intensity such as data recorded on magnetic tapes or in magnetic bubble memories.

SUMMARY OF THE INVENTION

The invention therefore relates to a magnetoresistance-effect sensor which essentially comprises a layer of semiconductor material having a first face and a second face, a layer of ferrimagnetic material which covers the first face of the layer of semiconductor material, at least one pair of electrodes placed on the second face of the layer of semiconductor material.

The invention is also concerned with a method of fabrication of a magnetoresistance-effect sensor which essentially comprises the following different steps:

(a) a first step involving deposition of a layer of ferrimagnetic material on a first substrate;

(b) a second step involving deposition of a layer of semiconductor material on the layer of ferrimagnetic material;

(c) a third step involving deposition of electrodes on the layer of semiconductor material;

(d) a fourth step involving bonding the face of the component thus obtained which carries the electrodes to a second substrate of insulating material;

(e) a fifth step involving removal of all or part of the first substrate.

Finally, the invention is also concerned with a magnetic-domain detector comprising a magnetic data carrier having at least one domain for inducing a magnetic field in a first predetermined direction. Said domain detector is also provided with a sensor which mainly comprises the following constituents:

a layer of semiconductor material having a first and a second face;

a layer of ferrimagnetic material deposited on the first face of the semiconductor material;

at least one pair of electrodes placed on the second face of the semiconductor material in a second direction;

said sensor being arranged so as to ensure that the face which carries the layer of ferrimagnetic material is located in proximity to the magnetic data carriers and that the second direction of the two electrodes is perpendicular to the first direction of the magnetic field.

BRIEF DESCRIPTION OF THE DRAWINGS

Other features of the invention will be more apparent upon consideration of the following description and accompanying drawings, wherein:

FIGS 1 to 5 illustrate one example of a method of fabrication of a linear magnetoresistance-effect sensor in accordance with the invention;

FIG. 6 illustrates one example of a detector in accordance with the invention;

FIG. 7 illustrates an alternative embodiment of a detector in accordance with the invention;

FIG. 8 illustrates another alternative embodiment of a detector in accordance with the invention.

DETAILED DESCRIPTION OF THE INVENTION

A sensor constructed in accordance with the invention comprises, as shown in FIG. 5, a layer 3 of semiconductor material, said layer being adapted to carry a layer 2 of ferrimagnetic material on one face and pairs such as the pair 4 of electrodes 41, 42 on the opposite face. The drawing does not show the connecting leads which extend from the electrodes 41 and 42 to utilization circuits such as CCD circuits (charge-coupled device). The completed assembly is mounted by bonding to a support block 5 which has the function of ensuring rigidity and of maintaining the component just described.

Referring to FIGS. 1 to 5, one example of a method of fabrication of a sensor in accordance with the invention will now be described.

In a first step, a ferrimagnetic material such as yttrium-iron-garnet (YIG) is grown on a substrate 1 of flat shape fabricated from gallium-gadolinium-garnet (GGG).

The growth process just mentioned can be achieved either by liquid-phase epitaxy at a temperature of 980° C. and at atmospheric pressure or by vapor-phase epitaxy at a temperature within the range of 400° C. to 700°

C. and at a pressure of 50 to 500 millibars or finally by cathode sputtering.

The thickness h1 of the layer 2 of ferrimagnetic material thus obtained must be approximately 3 microns. A wafer as shown in FIG. 1 is thus obtained.

A second step is then performed and consists in depositing a layer 3 of semiconductor material on the previous layer 2 (as shown in FIG. 2). The semiconductor material chosen will consist of elements of groups III and V (or II and VI) of the periodic table. The lattice constant will be a submultiple of the constant of the ferrimagnetic material 2 or will have a lattice area which is compatible with the lattice area of said ferrimagnetic material whereby the layer of ferrimagnetic material and layer of semiconductor constitute a monocrystal because of the matched latice constants.

Deposition can be performed by a process of vapor-phase epitaxy, otherwise known as chemical vapor deposition (CVD) and more precisely by vapor-phase epitaxy of organometallic compounds, designated as metalorganic chemical vapor deposition (MOCVD). Epitaxy takes place at a temperature within the range of 450° C. to 700° C. and at a pressure within the range of 50 millibars to 500 millibars. The rate of deposition for ensuring correct matching between the epitaxially grown material and the layer 2 is preferably chosen between 20 Angströms and 300 Angströms per minute. The thickness h2 of the layer thus obtained must be within the range of 5 to 10 microns. A wafer as shown in FIG. 2 is thus obtained.

In a third step, metal electrodes such as those designated by the references 41 and 42 in FIG. 3 are deposited on the free surface of the layer 3 by any process already known in this technique. These electrodes are arranged in pairs such as the pair 4 in the case of the electrodes 41 and 42. By way of constructional example, these pairs of electrodes have been deposited in a linear array or row as shown in FIG. 3.

The distance e1 between two electrodes of one and the same pair is approximately 10 microns. The distance e2 or center-to-center spacing of two pairs of electrodes is within the range of 3 to 5 microns.

In a fourth step, a rigid insulating substrate 5 is bonded to the surface of the layer 3 which carries the electrodes 41, 42. This bonding operation can be performed by any known method such as joining by adhesives. A component as shown in FIG. 4 is thus obtained.

In a fifth step, the substrate 1 is removed by means of a process which is suited to the nature of the substrate 1, such as mechanical or chemical machining. Total removal of the substrate 1 is not an essential requirement but it will prove advisable to ensure that the thickness of substrate which may be permitted to remain does not exceed 0.5 micron. A sensor as shown in FIG. 5 is accordingly obtained.

A point worthy of note is that removal of the substrate 1 could have been performed between the second or third step or between the third and the fourth step.

In a variant of the method of fabrication in accordance with the invention, the substrate 1 can be a salt of barium and fluorine ($BaF_2$). In this case, deposition of the layer of ferrimagnetic material is performed by cathode sputtering. It is also advisable to provide for crystallization by annealing after this deposition and prior to deposition of the semiconductor material 3.

Subsequent removal of the substrate 1 will then be carried out by dissolving salt in a suitable solution.

As in the previous steps, a sensor as shown in FIG. 5 is thus obtained.

A sensor of this type may be employed as a detector for magnetic data recorded on a magnetic data carrier. This data carrier can be a magnetic tape, a magnetic card, bubble memories, and so on. There is shown by way of example in FIG. 6 a magnetic tape 6 which carries magnetic data 70, 71, 72 and so on, these data being arranged in a line or row such as the row 7 which is transverse to the tape 6.

The tape 6 travels in the direction of the arrow F, beneath the sensor described earlier. The data such as those designated by the references 70, 71, 72 are placed at uniform intervals equal to the pitch or spacing (e2) of the pairs of electrodes. When the tape 6 is moving, the row of data 7 moves in proximity to the sensor layer 2 at a distance of approximately 2 to 3 microns, each data item such as the item 71 being located beneath a pair of electrodes such as the pair 4.

Each pair of electrodes is oriented along an axis OX. The row of pairs of electrodes is oriented along an axis OY perpendicular to the axis OX. In consequence, a row of data 7 is also oriented along the axis OY. A data item such as the item 71 induces a magnetic field which, in the layer 3 and in proximity to the pair of electrodes 4, is parallel to the axis OY.

The YIG layer has the effect of transferring the magnetic field at the surface of the tape to the level of the semiconductor with a scale factor which is directly dependent on the magnetization of the garnet. In fact, at a distance corresponding to approximately the width of the track, the value of the field is approximately 400 G whereas it would be ten times less if the YIG layer were not present.

Reproduction of a magnetized pattern in a magnetic data carrier can be analyzed by means of the configuration of domains in a garnet layer. If the leakage fields of the tape and of the garnet are compared, a scale factor is therefore clearly established.

By subjecting the semiconductor layer 3 formed on the layer 2 by epitaxial growth to a magnetic field by linear magnetoresistance effect (LMR effect), the leakage field of the magnetic domains of the tape is accordingly detected. The high anisotropy of YIG makes it possible to increase and to guide the magnetic leakage field of the bits to be read.

In the case of application to reading of a magnetic data carrier which travels beneath the sensor, it will prove advantageous at the time of removal of the substrate layer 1 to allow a small thickness (0.5 micron, for example) to remain. This substrate layer will perform the function of a mechanical resistance layer and will serve to protect the ferrimagnetic layer 2.

In an alternative embodiment shown in FIG. 7, there is associated with the row of pairs 4 of electrodes a charge-transfer line (CCD line) 8 comprising a number of cells 80 to 81 corresponding to the number of pairs of electrodes, one cell being coupled with each pair of electrodes. A structure of this type will serve to facilitate simultaneous reading of one row of data items.

In another alternative embodiment of the invention as shown in FIG. 8, a plurality of sensors of the type hereinabove described are associated in order to permit simultaneous reading of a matrix of data disposed on a data carrier. In this example of construction, the sensors thus associated are in fact constructed in one piece, thus permitting low-cost manufacture of a reading head which is adapted to a specific use. There is thus shown in FIG. 8 a reading head comprising four rows of pairs of electrodes (such as the pairs 4 and 9) placed on the same layer 3 of semiconductor material but provision could be made for a greater number.

An arrangement of this type can be adapted to reading of data bits of approximately 3 microns×3 microns, namely detectable magnetic domains having a surface area of 10 microns square.

What is claimed is:

1. A linear magnetoresistance-effect sensor comprising a layer of semiconductor material provided to detect magnetic fields perpendicular to said layer of semiconductor material and having a first face and a second face, a layer of ferrimagnetic material exhibiting high anisotrophy provided to guide and transfer said magnetic fields to said semiconductor material by a scale factor substantially greater than one, thereby to increase an amount of an adjacent magnetic field which reached said semiconductor layer by magnetoresistance effect and increase sensitivity to detection of magnetic fields, said layer of ferrimagnetic material covering the first face of the layer of semiconductor material and constituting with said layer of semiconductor material a monocrystal, at least one pair of electrodes placed on the second face of the layer of semiconductor material.

2. A linear magnetoresistance-effect sensor according to claim 1, wherein the layer of semiconductor material is formed by compounds of Groups III and V of the Periodic Table.

3. A linear magnetoresistance-effect sensor according to claim 1, wherein the layer of semiconductor material is formed by compounds of Groups II and VI of the Periodic Table.

4. A linear magnetoresistance-effect sensor according to claim 1, wherein the layer of ferrimagnetic material is a layer of yttrium-iron-garnet.

5. A magnetoresistance-effect sensor according to claim 1, comprising a layer of a substrate which covers the layer of ferrimagnetic material.

6. A magnetoresistance-effect sensor according to claim 5, wherein the substrate layer is a gallium-gadolinium garnet.

7. A magnetoresistance-effect sensor according to claim 6, wherein the gallium-gadolinium garnet is doped with calcium, magnesium and zirconium.

8. A magnetoresistance-effect sensor according to claim 1, comprising pairs of electrodes disposed in a matrix on the second layer of semiconductor material.

9. A magnetic domain detector comprising a magnetic data carrier having at least one domain for inducing a magnetic field in a first predetermined direction, wherein said detector also comprises a sensor comprising:

a layer of semiconductor material provided to detect magnetic fields perpendicular to said layer of semiconductor material and having a first and second face;

a layer of ferrimagnetic material exhibiting high anisotropy provided to guide and transfer said magnetic fields to said semiconductor material by a scale factor substantially greater than one, thereby to increase an amount of an adjacent magnetic field which reaches said semiconductor layer by magnetoresistance effect and increase sensitivity to detection of magnetic fields, said layer of ferrimagnetic material deposited on the first face of the semiconductor material and constituting with said layer of semiconductor material a monocrystal;

at least one pair of electrodes placed on the second face of the semiconductor material in a second direction;

said sensor being arranged so as to ensure that the face which carries the layer of ferrimagnetic material is located in proximity to the magnetic data carrier and that the second direction of the two electrodes is perpendicular to the first direction of the magnetic field.

10. A magnetic domain detector according to claim 9, wherein the magnetic data carrier comprises a series of magnetic domains having a predetermined arrangement, wherein the second face of the semiconductor material comprises a series of pairs of electrodes having an arrangement which is identical with that of the magnetic domains.

11. A magnetic domain detector according to claim 10, wherein a common electrode is formed by interconnecting one electrode out of two in each pair of electrodes.

12. A magnetic domain detector according to claim 9, wherein the magnetic domains are placed at uniform intervals in a linear array and wherein the pairs of electrodes are placed at the same intervals in a linear array.

13. A magnetic domain detector according to claim 12, comprising a charge-transfer (CCD) line placed in parallel relation to the linear array of pairs of electrodes and each element of the charge-transfer (CCD) line is coupled with one pair of electrodes.

* * * * *